United States Patent [19]

Busse et al.

[11] Patent Number: 5,047,466
[45] Date of Patent: Sep. 10, 1991

[54] AMINO RESIN SOLUTIONS HAVING LOW ELECTRICAL CONDUCTIVITY

[75] Inventors: Gerd Busse, Mutterstadt; Jakob Decher, Bobenheim-Roxheim; Wolfgang Eisele, Ludwigshafen; Edgar Haeussler, Boehl-Iggelheim; Otto Wittmann, Frankenthal, all of Fed. Rep. of Germany

[73] Assignee: BASF Aktiengesellschaft, Ludwigshafen, Fed. Rep. of Germany

[21] Appl. No.: 476,760

[22] Filed: Feb. 8, 1990

[30] Foreign Application Priority Data

Feb. 25, 1989 [DE] Fed. Rep. of Germany ....... 3905913

[51] Int. Cl.$^5$ .............................................. C08L 61/32
[52] U.S. Cl. ................................... 524/597; 524/714; 524/765; 524/773; 524/843; 524/877; 528/232; 528/239; 528/243; 528/254
[58] Field of Search ............... 524/597, 714, 765, 773, 524/843, 877; 528/232, 239, 243, 254

[56] References Cited

U.S. PATENT DOCUMENTS

| | | | |
|---|---|---|---|
| 2,529,856 | 11/1950 | West et al. ........................... | 528/232 |
| 4,163,835 | 8/1979 | Piesch ................................. | 528/254 |
| 4,535,031 | 8/1985 | Dorries et al. ...................... | 428/481 |

FOREIGN PATENT DOCUMENTS 2603768 9/1982 Fed. Rep. of Germany .

OTHER PUBLICATIONS

Houben-Weyl, Methoden Der Organischen Chemie, Bd. XIV/2, 361-368.
Ullmans Encyklopädie der Technischen Chemi, 1953, Bd. 3, 487-489.

Primary Examiner—John Kight, III
Assistant Examiner—Sam A. Acquah
Attorney, Agent, or Firm—Keil & Weinkauf

[57] ABSTRACT

Amino resin solutions having an electrical conductivity of $<100$ $\mu$S/cm for impregnating paper are obtainable by A) methylolation of melamine with aqueous formaldehyde in a molar ratio of from 1:2 to 1:5 in the presence of a tertiary organic amine at a pH of from 7 to 12,
B) etherification with a molar excess, based on the methylol groups, of a $C_1$–$C_4$-alcohol in the presence of an unsubstituted or substituted dicarboxylic acid and/or polycarboxylic acid at a pH of from 3 to 6,
C) neutralization of the reaction mixture with an inorganic base and removal of the volatile components by distillation, except for a water content of $<10\%$ by weight, based on the reaction mixture, and
D) addition of a $C_1$–$C_4$-alcohol to give a solids content of from 40 to 90% by weight, based on the amino resin solution, and removal of insoluble components by filtration.

6 Claims, No Drawings

AMINO RESIN SOLUTIONS HAVING LOW ELECTRICAL CONDUCTIVITY

The present invention relates to amino resin solutions having an electrical conductivity of <100 µS/cm and obtainable by methylolating melamine with formaldehyde and then etherifying the product, distilling off volatile components from the neutralized reaction mixture, except for a small water content, adding an alcohol and removing the insoluble components by filtration.

For the production of electrical circuit boards, resin-impregnated papers, i.e. hard papers, are used. Solutions of phenol resins or cresol resol resins have been used to date for impregnating these papers. The papers impregnated with an alcoholic or alcoholic aqueous solution were subjected to a drying and hardening process.

The mechanical properties of the papers are influenced by the degree of condensation of the resols or by impregnation in one or more steps. Plasticizers may also be added to the impregnating solutions in order to improve the flexibility of the papers and to avoid embrittlement and cracks. Since the resol resin solutions have a low content of ions, if any at all, they are suitable for the production of hard papers, which must have low electrical conductivity or high electrical resistance.

High quality hard papers are rendered flameproof or fire-resistant with suitable flameproofing agents. These are brominated or chlorinated compounds. If chlorinated or brominated phenols are used in the resol resin synthesis, a flameproofing effect is obtained. However, as a result of this halogen-containing toxic pyrolysis products may form under pyrolysis conditions, for example a fire acting externally on the impregnated material, and this is unacceptable from environmental points of view. Hard papers which have only been impregnated with phenol and/or cresol resol resins but not flameproofed burn too easily.

Etherified methylolmelamine resins are known and are described in, for example, Houben-Weyl, Methoden der Organischen Chemie, Volume XIV/2, pages 361–368, and Ullmann Encyklopädie der Technischen Chemie, 1953, Volume 3, 487–489. Since the etherification is carried out in the presence of acidic catalysts, the latter have to be separated off after neutralization; to date, it has not been possible to separate off the said catalysts completely, so that, when the products were stored, undesirable turbidity occurred and the electrolytes which had not been removed caused a substantial reduction in the electrical resistance and in the creep resistance of the moldings produced using these aminoplast resins.

U.S. Pat. No. 2,529,856 describes a process for the preparation of etherified methylolmelamine resins by reaction of methanol with acidified polymethylolmelamine, neutralization and subsequent removal of water. These resins too are not electrolyte-free.

According to German Patent 2,603,768, electrolyte-free aminoplasts are obtained if methylolaminetriazines are condensed with special glycol derivatives in the absence of acids and alkalis. However, only very special aminoplasts can be prepared by this process.

It is an object of the present invention to provide aqueous amino resin solutions having low electrical conductivity, for impregnating substrates which can be pressed to give laminates which have good technical properties, are fire-resistant and are suitable for the production of electrical circuit boards.

We have found that this object is achieved by methylolation and etherification of melamine with subsequent removal of insoluble components by certain measures.

The present invention relates to amino resin solutions having an electrical conductivity of <100 µS/cm for impregnating paper, which are obtainable by
A) methylolation of melamine with aqueous formaldehyde in a molar ratio of from 1:2 to 1:5 in the presence of a tertiary organic amine at a pH of from 7 to 12,
B) etherification with a molar excess, based on the methylol groups, of a $C_1$–$C_4$-alcohol in the presence of an unsubstituted or substituted dicarboxylic acid and/or polycarboxylic acid at a pH of from 3 to 6,
C) neutralization of the reaction mixture with an inorganic base and removal of the volatile components by distillation, except for a water content of <10% by weight, based on the reaction mixture, and
D) addition of a $C_1$–$C_4$-alcohol to give a solids content of from 40 to 90% by weight, based on the amino resin solution, and removal of insoluble components by filtration.

The present invention furthermore relates to the use of the amino resin solutions for the production of laminates, the laminates themselves, the use of these laminates for the production of electrical circuit boards, and the electrical circuit boards themselves.

Regarding the components and reaction stages, the following may be stated specifically.

In stage (A), the methylolation of melamine with aqueous formaldehyde in a molar ratio of from 1:2 to 1:5, preferably from 1:3.5 to 1:4, in the presence of an organic tertiary amine is carried out at a pH of from 7 to 12, preferably from 6.8 to 7.2.

Suitable organic tertiary amines are aliphatic mono-, di- or polyamines of 3 to 20 carbon atoms which may be substituted, for example trimethylamine, triethylamine, tri-n-propylamine, triisopropylamine, tributylamine, triisobutylamine and hexamethylenetetramine. Amino alcohols, such as triethanolamine, triisopropanolamine and diethylethanolamine, are also suitable. Triethanolamine, triethylamine and hexamethylenetetramine are preferably used. It is also possible to use mixtures of the stated amines.

In stage (B), a pH of from 3 to 6, preferably from 3.5 to 5, in particular from 4 to 4.5, is obtained using a di- or polycarboxylic acid which may be substituted. Examples of suitable dicarboxylic acids are oxalic acid, maleic acid, malonic acid, succinic acid, adipic acid and phthalic acid. Substituted dicarboxylic acids which may be used are dimethylmalonic acid, hydroxysuccinic acid and tartaric acid.

An example of a suitable polycarboxylic acid is citric acid, which may be substituted.

Oxalic acid, malonic acid and citric acid are preferably used.

At this pH obtained with the organic acids, etherification is carried out using a molar excess, based on the methylol groups of the methylolated melamine, of a $C_1$–$C_4$-alcohol at conventional temperatures of, for example, 50° to 60° C.

Examples of suitable $C_1$–$C_4$-alcohols are methanol, ethanol, n-propanol, isopropanol and n-butanol. Methanol is preferably used.

In (C), after the etherification stage, the reaction mixture is neutralized with an inorganic base and freed from the volatile components by distillation, until the water content is <10, preferably <6, % by weight, based on the reaction mixture.

Suitable inorganic bases are alkali metal and/or alkaline earth metal hydroxides, such as sodium hydroxide, potassium hydroxide, calcium hydroxide and barium hydroxide. Sodium hydroxide is preferably used.

The volatile components, such as amine, alcohols and water, can be distilled off under atmospheric pressure or under reduced pressures of from 50 to 100 mbar. Stepwise distillation beginning at atmospheric pressure with subsequent distillation under from 50 to 100 mbar has proven useful.

In stage (D), a $C_1$-$C_4$-alcohol is added in the amount required to give a solids content of from 40 to 90, preferably from 60 to 65, % by weight, based on the amino resin solutions. Suitable $C_1$-$C_4$-alcohols are methanol, ethanol and propanol. Methanol is preferably used. The insoluble precipitate of the amino resin solution is separated off by filtration, for example through a paper filter.

The solution thus obtained can once again be freed from its volatile components by distillation and then brought to the desired solids content with a $C_1$-$C_4$-alcohol.

The novel amino resin solutions are infinitely miscible with methanol and miscible with water in a ratio of at least 1:1.5, preferably 1:∞. The electrical conductivity is <100, preferably <50, particularly preferably <20, μS/cm.

These amino resin solutions are suitable for impregnating fiber material based on cellulose, glass or synthetic polymers, such as polyethylene, polypropylene, polyamide or polyester. Impregnation can be carried out using the amino resin solutions with or without curing agents.

Suitable curing agents are, for example, formic acid, maleic acid and paratoluenesulfonic acid.

The substrates are impregnated with from 20 to 120, preferably from 80 to 100, % by weight, based on the substrate weight, of solid resin. The impregnated products are dried, for example, in suspension slot-nozzle driers at air temperatures of from 120° to 180° C., preferably from 140° to 160° C.

The novel amino resin solutions can also be applied to the substrate in two successive impregnation steps. For example, it is possible, before or after impregnation with the novel products, to apply conventional phenol/formaldehyde condensates to the substrate or to process these mixtures with one another.

A plurality of layers of the impregnated and predried product are then pressed to give a laminate at about 130°–180° C., preferably 150°–170° C., and under from 7 to 18, preferably from 8 to 10, N/mm$^2$ in platen presses.

These laminates have a volume resistivity according to DIN 53,482 of from $10^8$ to $10^{12}$, preferably from $10^{10}$ to $10^{11}$, Ω.cm and a surface resistivity according to DIN 53,482 of from $10^9$ to $10^{12}$, preferably from $10^{10}$ to $10^{11}$, Ω. The water absorption of the laminate according to DIN 40,802 is not more than 40 mg, preferably 20–30 mg.

The novel amino resins solutions are preferably used for impregnating cellulosic substrates, such as paper. The laminates produced therefrom are highly flexible and punchable and conform to standards in the fire test. They are very useful for the production of electrical circuit boards.

EXAMPLE 1

In a reaction vessel, 357 g of 40% strength by weight aqueous formaldehyde were brought to a pH of 7.2 with 1 g of triethanolamine. After the addition of 150 g of melamine (molar ratio of melamine (M) to formaldehyde (F)=1:4), the reaction mixture was heated to 90° C., kept at this temperature for 5 minutes and cooled to 65° C. The methylolation product obtained was then diluted with 600 g of methanol, brought to a pH of 4.2 with 5.3 g of oxalic acid and etherified for 45 minutes at 50° C. The etherification reaction was terminated by adding 13.7 g of 25% strength by weight sodium hydroxide solution. Excess methanol was distilled off, initially under atmospheric pressure and then under a reduced pressure of 50–100 mbar. The resin thus obtained was again diluted with 240 g of methanol, and the excess methanol was once again distilled off, initially under atmospheric pressure to 90° C. and then under reduced pressure to 60° C.

The resin was then diluted with 120 g of methanol and was filtered.

340 g of a novel resin solution having the following analytical data were obtained:

| | |
|---|---|
| Nonvolatile components (2 g, 2 h, 125° C.) | 65.2% by weight |
| Water content | 4.38% by weight |
| Miscibility with water | Infinite |
| Electrical conductivity | 19 microsiemens |

EXAMPLE 2

In a reaction vessel, 100 g of triethanolamine were added to 36 kg of 40% strength by weight aqueous formaldehyde solution, a pH of 7.2 resulting. 15 kg of melamine were added to this solution, which was then methylolated by heating to 90° C. and maintaining this temperature for 5 minutes. After the mixture had been cooled to 65° C., 60 kg of methanol and 500 g of oxalic acid were added. The etherification was carried out in the course of 45 minutes at 50° C. and at a pH of 4.3 and was stopped by adding 1,340 g of 25% strength by weight sodium hydroxide solution. Excess methanol was distilled off, initially under atmospheric pressure to 90° C. and then under reduced pressure. The resin thus obtained was again diluted with 24 kg of methanol and was concentrated again in the manner described above. Finally, the resin was diluted with 12 kg of methanol and was filtered.

34 kg of a novel resin solution having the following analytical data were obtained:

| | |
|---|---|
| Nonvolatile components | 68.1% by weight |
| Viscosity | 0.2 Pa.s |
| Water content | 2.9% by weight |
| Miscibility with water | Infinite |
| Electrical conductivity | 18 microsiemens |

EXAMPLE 3

In a reaction vessel, 363 g of 40% strength by weight aqueous formaldehyde were brought to a pH of 7.0 with 0.9 g of triethanolamine. After the addition of 150 g of melamine (molar ratio of M to F=1:4.07), the reaction mixture was heated to 90° C., kept at this temperature for 5 minutes and cooled to 75°. The polymethylolated melamine obtained in this manner was etherified at a pH of 4.5 and at 50° C. for 45 minutes after the addition of 600 g of methanol and 5 g of citric acid. The etherification reaction was terminated by adding 12 g of 25% strength by weight sodium hydroxide solution, and excess methanol was distilled off, initially under atmospheric pressure to a temperature of 90° C. and then, after cooling, under a reduced pressure to a temperature of 36° C. The cloudy resin thus obtained was again diluted with 240g of methanol, and the alcohol was once again distilled off, initially under atmospheric pressure to a temperature of 90° C. and then under reduced pressure to a temperature of 50° C.

The resin thus obtained was diluted with 150 g of methanol.

365 g of a novel resin solution having the following analytical data were obtained:

| | |
|---|---|
| Nonvolatile components (2 g, 2 h, 125° C.) | 60.3% by weight |
| Viscosity | 100 mPa.s |
| Water content | 5.5% by weight |
| Miscibility with water | Infinite |
| Electrical conductivity | 24 microsiemens |

EXAMPLE 4

In a reaction vessel, 357 g of 40% strength by weight aqueous formaldehyde were brought to a pH of 7.0 with 4 g of hexamethylenetetramine. After the addition of 150 g of melamine (molar ratio of M to F=1:4), the reaction mixture was heated to 90° C., kept at this temperature for 5 minutes and then cooled to 65° C. The methylolation product obtained was then diluted with 600 g of methanol, brought to a pH of 4.5 with 5.3 g of oxalic acid and etherified for 45 minutes at 50° C. The etherification was terminated by adding 13.7 g of 25% strength by weight sodium hydroxide solution. Excess methanol was distilled off, initially under atmospheric pressure and then under a reduced pressure. The resin thus obtained was diluted again with 240 g of methanol, and the excess methanol was distilled off, initially under atmospheric pressure to 90° C. and then under reduced pressure to 50° C. The resin was then diluted with 120 g of methanol.

340 g of a novel resin solution having the following analytical data were obtained:

| | |
|---|---|
| Nonvolatile components (2 g, 2 h, 125° C.) | 64.4% by weight |
| Water content | 6.0% by weight |
| Miscibility with water | Infinite |
| Electrical conductivity | 11 microsiemens |

EXAMPLE 5

In a reaction vessel, 363 g of 40% strength aqueous formaldehyde were brought to a pH of 7.0 with 0.9 g of triethanolamine. 150 g of melamine were added to this solution (molar ratio of M to F=1:4.07), the melamine being methylolated immediately by heating to 90° C. and maintaining this temperature for 5 minutes. After the reaction solution had been cooled to 75° C., 600 g of methanol and 5 g of malonic acid were added. The etherification was carried out in the course of 45 minutes of 50° C. and at a pH of 4.2 and was terminated by adding 15 g of 25% strength by weight sodium hydroxide solution. Excess methanol was distilled off, initially under atmospheric pressure to a temperature of 90° C. and then under a reduced pressure to a temperature of 36° C. The cloudy resin solution thus obtained was gain diluted with 240 g of methanol and was concentrated as described above. Dilution with 80 g of methanol gave the desired viscosity.

300 g of a novel resin solution having the following analytical data were obtained:

| | |
|---|---|
| Nonvolatile components (2 g, 2 h, 125° C.) | 63.5% by weight |
| Viscosity | 100 mPa.s |
| Water content | 5.2% by weight |
| Miscibility with water | Infinite |
| Electrical conductivity | 32 microsiemens |

EXAMPLE 6

Production of a laminate

Electrolyte-free paper made from soda pulp was impregnated with the resin solution from Example 1 by immersion, the amount of resin solution applied being 120 g/m$^2$. The paper web was dried to a residual moisture content of about 3% by weight in a suspension drier at decreasing temperatures from 160° to 140° C. The final film weight was 245 g/cm$^2$. The film web thus obtained was then cut to a size of 50×50 cm. For compaction, 8 such layers were pressed in a press under 8 N/mm$^2$ at an object temperature of 160° C. to give a laminate. The following properties were determined.

| Properties | |
|---|---|
| Volume resistivity [Ω · cm] in 23/50 bars DIN 53,482 | 1.0 · 10$^{11}$ |
| Surface resistivity [Ω] in 23/50 bars DIN 53,482 | 1.0 · 10$^{10}$ |
| Water absorption [mg] DIN 40,802 | 30 |

We claim:

1. An amino resin solution having an electrical conductivity of <100 μS/cm for impregnating paper, obtainable by
   A) methylolation of melamine with aqueous formaldehyde in a molar ratio of from 1:2 to 1:5 in the presence of a tertiary organic amine at a pH of from 7 to 12,
   B) etherification with a molar excess, based on the methylol groups, of a $C_1$-$C_4$-alcohol in the presence of an unsubstituted or substituted organic dicarboxylic acid and/or polycarboxylic acid at a pH of from 3 to 6,
   C) neutralization of the reaction mixture with an inorganic base and removal of the volatile components by distillation, except for a water content of <10% by weight, based on the reaction mixture, and
   D) addition of a $C_1$-$C_4$-alcohol to give a solids content of from 40 to 90% by weight, based on the amino resin solution, and removal of insoluble components by filtration.

2. An amino resin solution as claimed in claim 1, obtainable using methanol as the alcohol in the etherification (B).

3. An amino resin solution as claimed in claim 1, obtainable using an aliphatic $C_2$-$C_7$-dicarboxylic acid in the etherification (B).

4. An amino resin solution as claimed in claim 1, obtainable using oxalic acid, malonic acid or succinic acid as the dicarboxylic acid in the etherification (B).

5. An amino resin solution as claimed in claim 1, obtainable using hydroxysuccinic acid or tartaric acid as the substituted dicarboxylic acid in the etherification (B).

6. An amino resin solution as claimed in claim 1, obtainable using citric acid as the polycarboxylic acid in the etherification (B).

* * * * *